(12) United States Patent
Kondo

(10) Patent No.: US 7,257,297 B2
(45) Date of Patent: Aug. 14, 2007

(54) OPTICAL COMMUNICATION MODULE WITH PARTICULAR FIBER GUIDE HOLE, OPTICAL-COMMUNICATION-MODULE PRODUCTION METHOD, AND ELECTRONIC DEVICE

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 229 days.

(21) Appl. No.: 10/457,396

(22) Filed: Jun. 10, 2003

(65) Prior Publication Data

US 2004/0033029 A1    Feb. 19, 2004

(30) Foreign Application Priority Data

Jun. 18, 2002   (JP)   ............... 2002-177488

(51) Int. Cl.
*G02B 6/30*   (2006.01)
(52) U.S. Cl. ............................................. 385/49
(58) Field of Classification Search ............ 385/88–92; 372/43–50
See application file for complete search history.

(56) References Cited

U.S. PATENT DOCUMENTS

| | | | | |
|---|---|---|---|---|
| 5,692,084 A | * | 11/1997 | Roff | 385/88 |
| 5,937,124 A | * | 8/1999 | Roff | 385/88 |
| 6,496,469 B1 | * | 12/2002 | Uchizaki | 369/122 |
| 6,633,707 B1 | * | 10/2003 | Murali | 385/52 |
| 6,659,659 B1 | * | 12/2003 | Malone | 385/94 |
| 6,715,934 B2 | * | 4/2004 | Suzuki et al. | 385/88 |
| 6,757,308 B1 | * | 6/2004 | Eldring et al. | 372/36 |
| 6,793,405 B1 | | 9/2004 | Murata et al. | |
| 6,869,231 B2 | * | 3/2005 | Chiu et al. | 385/93 |
| 2002/0126356 A1 | * | 9/2002 | Nakanishi et al. | 359/163 |
| 2003/0201462 A1 | * | 10/2003 | Pommer et al. | 257/200 |

FOREIGN PATENT DOCUMENTS

| | | |
|---|---|---|
| JP | A 09-015442 | 1/1997 |
| JP | A 11-023914 | 1/1999 |
| JP | A 11-211942 | 8/1999 |
| JP | A 11-305079 | 11/1999 |
| JP | A 2000-121884 | 4/2000 |
| JP | A 2000-214351 | 8/2000 |
| JP | A 2000-353594 | 12/2000 |
| JP | A 2001-014966 | 1/2001 |
| JP | A 2002-151782 | 5/2002 |
| WO | WO 00/08505 A1 | 2/2000 |
| WO | WO 01/73492 A1 | 10/2001 |

\* cited by examiner

*Primary Examiner*—David Nelms
*Assistant Examiner*—Timothy L. Rude
(74) *Attorney, Agent, or Firm*—Oliff & Berridge, PLC

(57) ABSTRACT

An optical communication module in which an incident or emergent end of an optical fiber can be easily and precisely aligned with a light-emitting element or a light-receiving element. The optical communication module includes a base block that has a first surface and a second surface located opposite to the first surface, a microelement such as a light emitting element or a light-receiving element that contacts the first surface. The second surface includes an optical-fiber guide hole, and the microelement contacting the first surface and an optical-fiber received in the optical-fiber guide hole are separated by an intervening portion of the base block.

19 Claims, 18 Drawing Sheets

F I G. 1
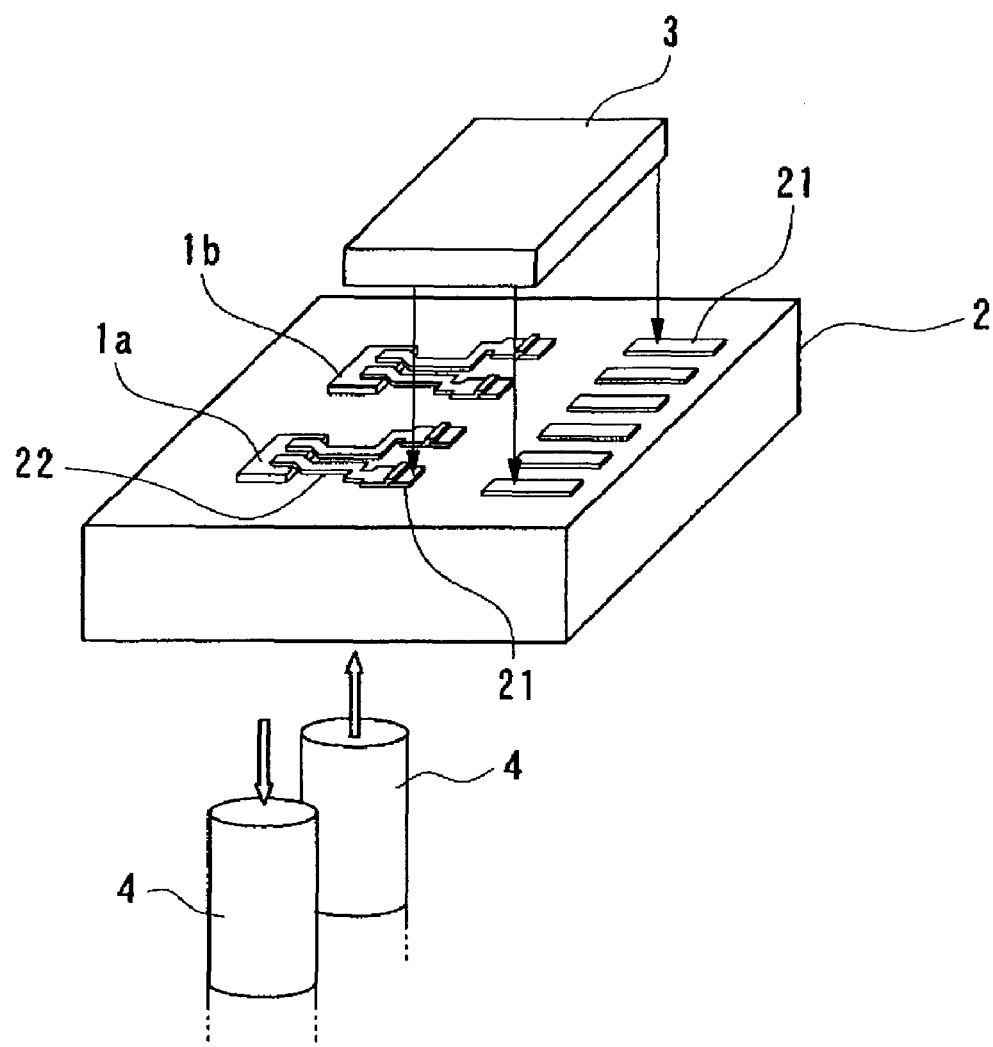

OPTICAL COMMUNICATION MODULE WITH PARTICULAR FIBER GUIDE HOLE, OPTICAL-COMMUNICATION-MODULE PRODUCTION METHOD, AND ELECTRONIC DEVICE

BACKGROUND OF THE INVENTION

1. Field of Invention

The present invention relates to an optical communication module, an optical-communication-module production method, and an electronic device.

2. Description of Related Art

In the related art, optical communication to transmit laser light using an optical fiber is performed. Semiconductor lasers are used as light-emitting elements serving as light sources in optical communication. While edge-emitting lasers that emit light from a side face obtained by cutting a wafer are used in the related art as the light-emitting elements, vertical-cavity surface-emitting lasers (VCSEL) to emit light from a semiconductor surface are also used in the related art. Moreover, optical communication modules in which an optical fiber, and an light-emitting element or a light-receiving element are combined, are used in the related art.

SUMMARY OF THE INVENTION

In the related art optical communication modules, however, it is difficult to align an incident or emergent end of the optical fiber with the light-emitting element or the light-receiving element, and a large amount of labor is needed to produce the optical communication modules.

On the other hand, surface-emitting lasers are advantageous as light sources for high-speed optical data communication because they have fast responsiveness and emit laser light in a direction perpendicular to a substrate.

However, since a surface-emitting laser emits light from the semiconductor surface in a direction perpendicular to the semiconductor substrate, which is different from the edge-emitting laser to emit light from the side face obtained by cutting the wafer, it is impossible to provide on a single substrate, the surface-emitting laser and an APC (Automatic Power Control) circuit to automatically control the amount of emitted light while receiving a part of light emitted from the surface-emitting laser.

Accordingly, a plurality of substrates (structures) are necessary in the related art to provide the surface-emitting laser with the APC circuit. This increases the size of the device, complicates the production process, and increases the production cost.

The present invention addresses the above and/or other circumstances, and provides an optical communication module in which an incident or emergent end of an optical fiber can be easily and precisely aligned with a light-emitting element or a light-receiving element, a production method for the optical communication module, and an electronic device.

The present invention also provides an optical communication module in which a surface-emitting laser-light source having an APC circuit can be easily structured, a production method for the optical communication module, and an electronic device.

In order to address or achieve the above, an optical communication module of the present invention has a base block to which at least one tile-like microelement is bonded and which is made of a transparent member having an optical-fiber guide hole.

According to this invention, an incident or emergent end of an optical fiber can be easily and precisely aligned with a light-emitting element or a light-receiving element only by bonding the light-emitting element or the light-receiving element formed of the tile-like microelement to a predetermined position on the base block and fitting the optical fiber in the optical-fiber guide hole.

For example, the tile-like microelement can be easily and precisely positioned by bonding the tile-like microelement to an intermediate transfer film and handling the intermediate transfer film in that state.

In the optical communication module of the present invention, preferably, the tile-like microelement and the base block are bonded with a transparent adhesive.

According to this invention, for example, when the optical-fiber guide hole formed in the base block is unpierced and the tile-like microelement bonded to the base block serves as a light-emitting element or a light-receiving element, light emitted from the optical fiber fitted in the guide hole can pass through a part of the transparent base block and the transparent adhesive and can enter the light-receiving element, or light emitted from the light-emitting element can pass through a part of the transparent base block and can enter the optical fiber.

Therefore, an optical signal can be transmitted between the light-emitting element or the light-receiving element, and the optical fiber without passing through a medium that is substantially different in refractive index, for example, air. This achieves a high-performance optical communication module.

Preferably, the optical communication module of the present invention further includes a substrate electrically connected to the tile-like microelement.

According to this invention, for example, a highly functional optical communication module can be easily achieved with a compact structure by bonding, to the base block, the substrate having an integrated circuit that forms a driving circuit or a signal processing circuit for the tile-like microelement.

In the optical communication module of the present invention, preferably, the tile-like microelement has at least one of a light-emitting element and a light-receiving element.

According to this invention, it is possible to construct an extremely compact optical communication module with high precision.

In the optical communication module of the present invention, preferably, the tile-like microelement bonded to the base block includes at least two tile-like microelements, at least one of the tile-like microelements is a light-emitting element, and at least one of the tile-like microelements is a light-receiving element.

According to this invention, it is possible to precisely construct an extremely compact optical communication module that includes both a transmitting device and a receiving device.

In the optical communication module of the present invention, preferably, the light-emitting element is one of a surface emitting laser and a light emitting diode.

According to this invention, it is possible to precisely construct an extremely compact optical communication module that is capable of high-speed optical communication.

In the optical communication module of the present invention, preferably, the light-receiving element is a photodiode.

In the optical communication module of the present invention, preferably, a center axis of the optical-fiber guide hole substantially coincides with a light-emission center axis of the light-emitting element.

According to this invention, the light-emitting element serving as the light emitting source (transmitting device) in optical communication can be precisely aligned with the optical fiber only by fitting the optical fiber in the optical-fiber guide hole.

In the optical communication module of the present invention, preferably, a center axis of the optical-fiber guide hole substantially coincides with a light-reception center axis of the light-receiving element.

According to this invention, the light-receiving element serving as the receiving device in optical communication can be precisely aligned with the optical fiber only by fitting the optical fiber in the optical-fiber guide hole.

In the optical communication module of the present invention, preferably, the optical fiber is fitted in the optical-fiber guide hole.

In the optical communication module of the present invention, preferably, a tile-like microelement having the light-emitting element is bonded on another tile-like microelement having a monitoring light-receiving element to detect light emitted from the light-emitting element of the tile-like microelement.

According to the present invention, it is possible to precisely construct an extremely compact optical communication module having a monitoring light-receiving element that detects the output (e.g., amount of light) from the light emitting source in optical communication.

In the optical communication module of the present invention, preferably, a light receiving section of the monitoring light-receiving element is placed on the light-emission center axis of the light-emitting element.

Preferably, the optical communication module of the present invention further includes an automatic power control circuit to control the amount of light emitted from the light-receiving element on the basis of the amount of received light detected by the monitoring light-receiving element.

According to the present invention, since the output (e.g., amount of emitted light) from the light-emitting element serving as the light emitting source in optical communication can be maintained at a desired fixed value by the automatic power control circuit, the output from the light-emitting element serving as a communication signal can be maintained at the desired fixed value, regardless of changes in ambient temperature and secular changes.

In the optical communication module of the present invention, preferably, a tile-like microelement having the light-emitting element is bonded on at least one other tile-like microelement having a light-emitting element that emits light having a wavelength different from the wavelength of light emitted from the light-emitting element of the tile-like microelement.

According to this invention, it is possible to easily, speedily, costlessly, and precisely produce an optical communication module for wavelength division multiplexing (WDM) optical communication in which a plurality of laser light beams having different wavelengths are transmitted by a single optical fiber.

In the optical communication module of the present invention, preferably, all the light-emitting elements are surface-emitting lasers, and are arranged so that laser light emitted from one of the surface-emitting lasers does not enter the other surface-emitting laser.

According to this invention, it is possible to prevent one of the surface-emitting lasers from being excited to emit light by laser light emitted from the other surface-emitting laser.

In the optical communication module of the present invention, preferably, the substrate is a silicon substrate.

According to this invention, for example, an integrated circuit that forms a driving circuit, a signal processing circuit, or the like of the tile-like microelement can be formed on the silicon substrate, and a highly functional and compact optical communication module can be constructed easily. Moreover, the integrated circuit or the like formed on the silicon substrate can be tested before being assembled into the optical communication module.

In the optical communication module of the present invention, preferably, the substrate has a driving circuit for the light-emitting element.

In the optical communication module of the present invention, preferably, the substrate has the automatic power control circuit.

Preferably, the optical communication module of the present invention further includes a housing connected to the base block so that one side thereof is substantially parallel to the longitudinal direction of the optical fiber fitted in the guide hole, and a fiber-fixing adhesive loaded to cover the base block, the housing, and the optical fiber around the optical-fiber guide hole of the base block.

According to this invention, the optical fiber can be easily and precisely positioned and fixed.

An optical-communication-module production method of the present invention includes: forming an unpierced optical-fiber guide hole in a base block made of a transparent member, and bonding a tile-like microelement having a light-emitting element or a light-receiving element to a surface of the base block opposing a bottom face of the optical-fiber guide hole.

According to this invention, it is possible to easily and precisely align an incident or emergent end of the optical fiber with the light-emitting element or the light-receiving element.

Preferably, the optical-communication-module production method of the present invention further includes: forming, on the tile-like microelement and the base block, a metal wire through which a driving current for the light-emitting element or a detection current from the light-receiving element flows, and bonding a substrate having an integrated circuit electrically connected to the metal wire to the base block.

According to this invention, for example, the substrate has an integrated circuit that forms a driving circuit, a signal processing circuit, or the like for the tile-like microelement, and the substrate is bonded to the base block, so that a highly functional and compact optical communication module can be constructed easily.

In the optical-communication-module production method of the present invention, preferably, the metal wire is formed by a droplet jet method.

According to this invention, it is possible to reduce the amount of the material of the metal wire, to easily cope with design changes and the like, and to reduce the production cost, compared with a method for forming a metal pattern by photolithography, etching, and the like.

In the optical-communication-module production method of the present invention, preferably, adhesive used to bond the tile-like microelement to the base block and to bond the substrate to the base block is applied by a droplet jet method.

According to this invention, it is possible to reduce the amount of the adhesive, to easily cope with design changes and the like, and to reduce the production cost.

In an optical-communication-module production method of the present invention includes: forming an unpierced optical-fiber guide hole in a base block made of a transparent member, bonding a tile-like microelement having a light-emitting element or a light-receiving element to a substrate, and bonding the substrate to the base block so that the light-emitting element or the light-receiving element is placed on a surface of the base block opposing a bottom face of the optical-fiber guide hole.

According to this invention, the light-emitting element or the light-receiving element, an integrated circuit provided on the substrate, and the like can be tested before they are assembled into an optical communication module. This can reduce defective optical communication modules.

An electronic device of the present invention has the above optical communication module.

According to this invention, it is possible to construct a compact electronic device having high-speed transmitting and receiving devices.

BRIEF DESCRIPTION OF THE DRAWINGS

FIG. 1 is a schematic assembly view of an optical communication module according to a first exemplary embodiment;

DETAILED DESCRIPTION OF PREFERRED EMBODIMENTS

An optical communication module according to the present invention is described below with reference to the drawings.

First Exemplary Embodiment

Figure 2:
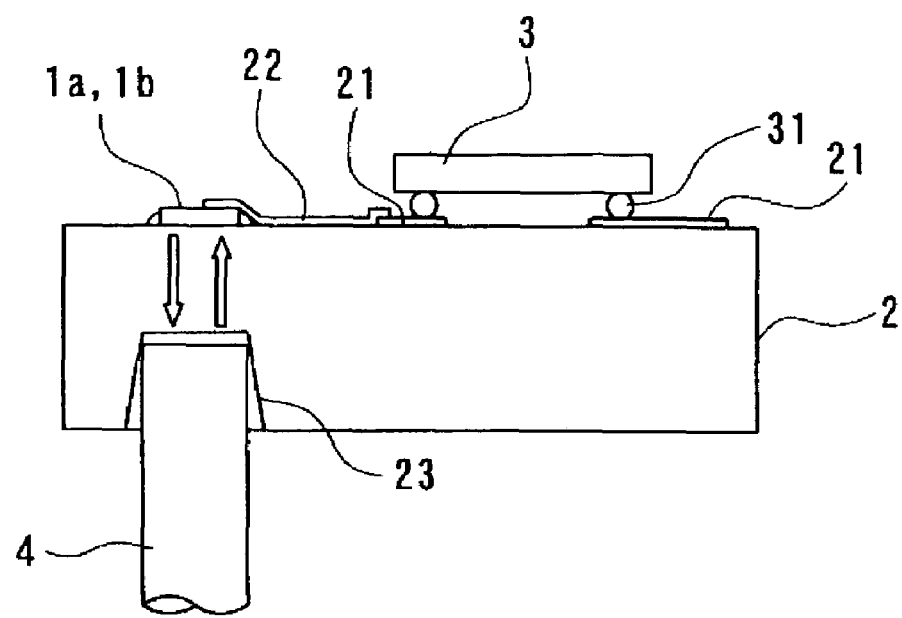
FIG. 2 is a schematic sectional view of the optical communication module.

FIG. 1 is a schematic assembly view of an optical communication module according to a first exemplary embodiment of the present invention. FIG. 2 is a schematic sectional view of the optical communication module shown in FIG. 1. The optical communication module includes a base block 2 which is made of a transparent member and on which a surface-emitting laser 1a serving as a light-emitting element, a photodiode 1b serving as a light-receiving element, and two optical-fiber guide holes 23 (first hole and second hole) are provided, and a substrate 3 bonded to the base block 2.

Each of the surface-emitting laser 1a and the photodiode 1b forms a semiconductor device (tile-like microelement) shaped like a miniature tile (plate), and is made of a rectangular platelike member that is, for example, 1 micrometer to 20 micrometers in thickness and is several tens of micrometers to several hundreds of micrometers in length and width. A production method for the tile-like microelement will be described later. The tile-like microelement may have shapes other than a rectangle.

The surface-emitting laser 1a and the photodiode 1b are bonded on the upper surface of the base block 2, that is, on a surface of the base block 2 opposing bottom faces of the optical-fiber guide holes 23 with a transparent adhesive (not shown). As shown in FIG. 2, the surface-emitting laser 1a is bonded on the upper surface of the base block 2 so that the center axis of the optical-fiber guide hole 23 (first hole) that is not pierced through the base block 2 substantially coincides with the light-emission center axis of the surface-emitting laser 1a. The photodiode 1b is bonded on the upper surface of the base block 2 so that the center axis of the optical-fiber guide hole 23 (second hole) substantially coincides with the light-reception center axis of the photodiode 1b.

Optical fibers 4 are fitted in the two optical-fiber guide holes 23.

A metal wire 22 is provided from the upper surface of the surface-emitting laser 1a onto the upper surface of the base block 2. A metal wire 22 is also provided from the upper surface of the photodiode 1b onto the upper surface of the base block 2. The metal wires 22 are metal patterns that electrically connect the surface-emitting laser 1a and the substrate 3, and the photodiode 1b and the substrate 3.

Preferably, the metal wires 22 are formed by a droplet jet method in which a metal pattern or the like is formed by jetting droplets of liquid containing metal from an ink jet nozzle (not shown).

This makes it possible to reduce the amount of the material, to easily cope with design changes and the like, and to reduce production cost, compared with a case in which a metal pattern is formed, for example, by photolithography and etching.

After the surface-emitting laser 1a and the photodiode 1b are bonded on the base block 2 and the metal wires 22 are disposed, the substrate 3 is bonded to the base block 2. The substrate 3 is electrically connected to the metal wires 22 by mounting bumps 31 provided as connecting members on the substrate 3 onto bonding pads 21 provided on the base block 2 beforehand. The substrate 3 is, for example, a silicon substrate, and has an integrated circuit including a driver circuit for the surface-emitting laser 1a, and so on.

In the above configuration, laser light emitted from the surface-emitting laser 1a passes through the transparent adhesive and the transparent base block 2, and enters the optical fiber 4 in the first hole. Laser light emitted from the optical fiber 4 in the second hole passes through the transparent base block 2 and the transparent adhesive, and enters the photodiode 1b.

Figure 3:
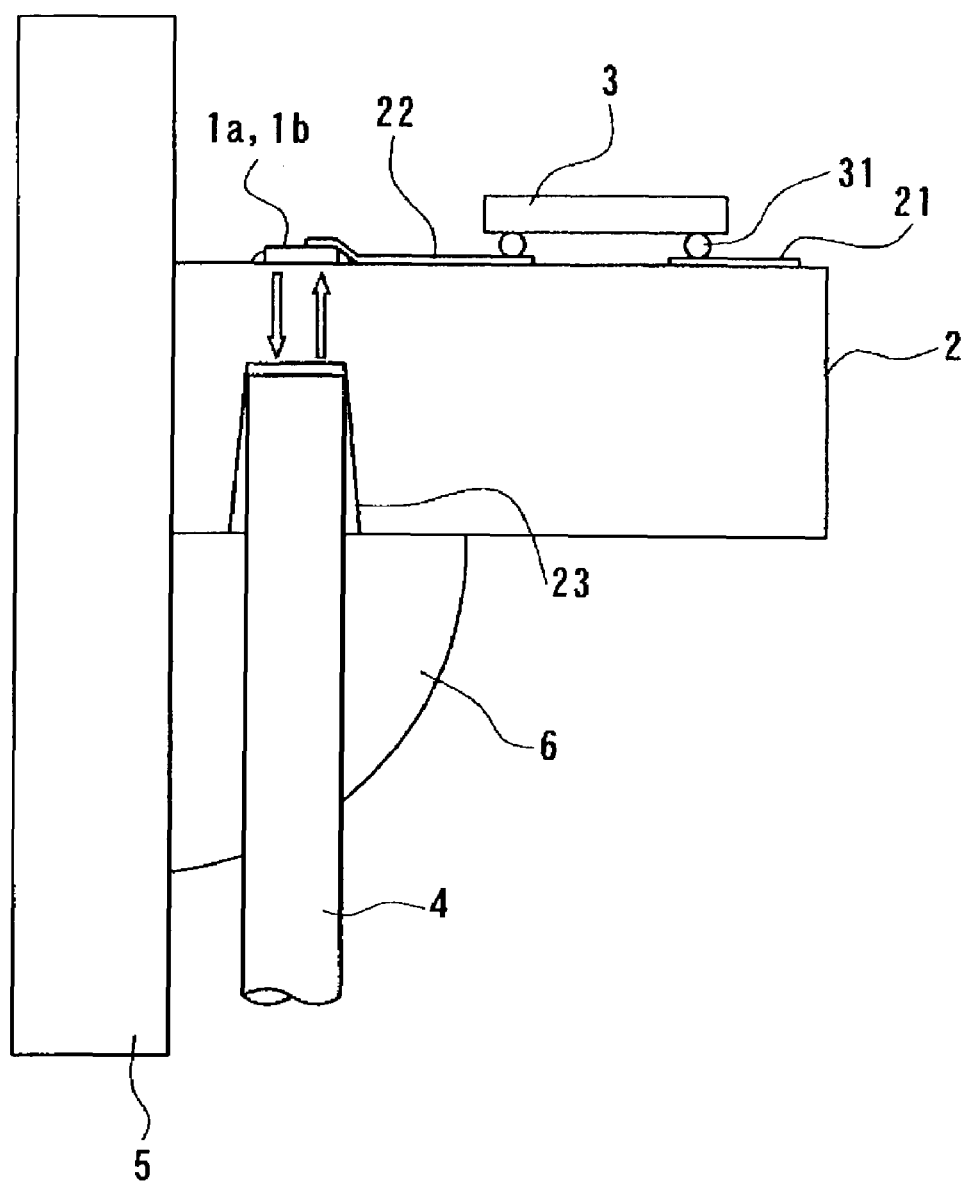
FIG. 3 is a schematic sectional view showing a state in which a structure for fixing optical fibers is added to the optical communication module.

A structure for fixing the optical fibers 4 is described below with reference to FIG. 3. FIG. 3 is a schematic sectional view showing a state in which a structure to fix the optical fibers is added to the above-described optical communication module. This optical communication module is obtained by adding a housing 5 and adhesive 6 to the optical communication module shown in FIGS. 1 and 2.

The housing 5 is connected to the base block 2 so that its side face is substantially parallel to the longitudinal direction of the optical fibers 4 fitted in the optical-fiber guide holes 23. The adhesive 6 is an adhesive to fix the optical fibers 4, and is loaded at a corner formed by the housing 5 and the base block 2 to cover the peripheries of the optical-fiber guide holes 23, a part of the side face of the housing 5, and a part of each optical fiber 4.

Accordingly, in the optical communication module of this exemplary embodiment, the optical fiber 4 and the surface-emitting laser 1a, and the optical fiber 4 and the photodiode 1b can be precisely positioned only by fitting the optical fibers 4 in the optical-fiber guide holes 23. This can shorten the production time of the optical communication module, and can reduce production cost.

Figure 4:
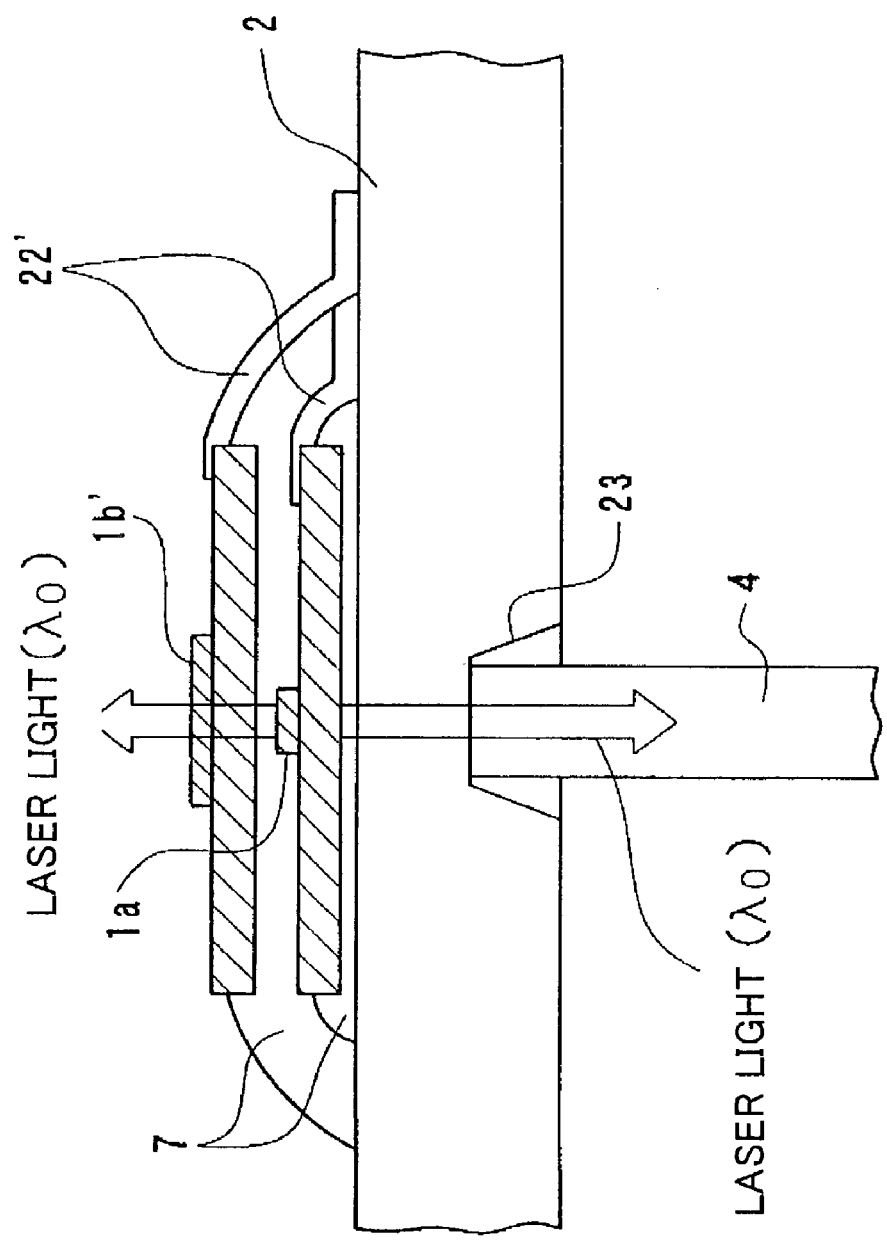
FIG. 4 is a schematic sectional view showing the principal part of an application of the optical communication module of this exemplary embodiment.

Preferably, a monitoring photodiode 1b' made of a tile-like microelement is bonded to the upper surface of the surface-emitting laser 1a made of a tile-like microelement with transparent adhesive 7, as shown in FIG. 4. FIG. 4 is a schematic sectional view showing the principal parts of an application of the optical communication module of this embodiment. Laser light is emitted from the surface-emitting laser 1a toward the optical fiber 4 (downward), and laser light is also emitted toward the side remote from the optical fiber 4 (upward). Since the laser light emitted upward from the optical laser 1a enters the monitoring photodiode 1b', the monitoring photodiode 1b' can detect the intensity of laser light output from the surface-emitting laser 1a.

Preferably, the monitoring photodiode 1b' is placed so that a light-receiving section thereof is positioned on the light-emission center axis of the surface-emitting laser 1a. Preferably, an automatic power control (APC) circuit is provided on the substrate 3 to control a driving signal for the surface-emitting laser 1a on the basis of the amount of received light detected by the monitoring photodiode 1b'. The monitoring photodiode 1b' and the surface-emitting laser 1a are electrically connected to the automatic power control circuit, the driver circuit, and the like through wires 22', bonding pads 21, and the like.

Since the laser output (amount of emitted light) from the surface-emitting laser 1a is thereby automatically controlled to be a desired fixed value, it can be maintained at the desired fixed value, regardless of changes in ambient temperature, secular changes, and the like.

Figure 5:
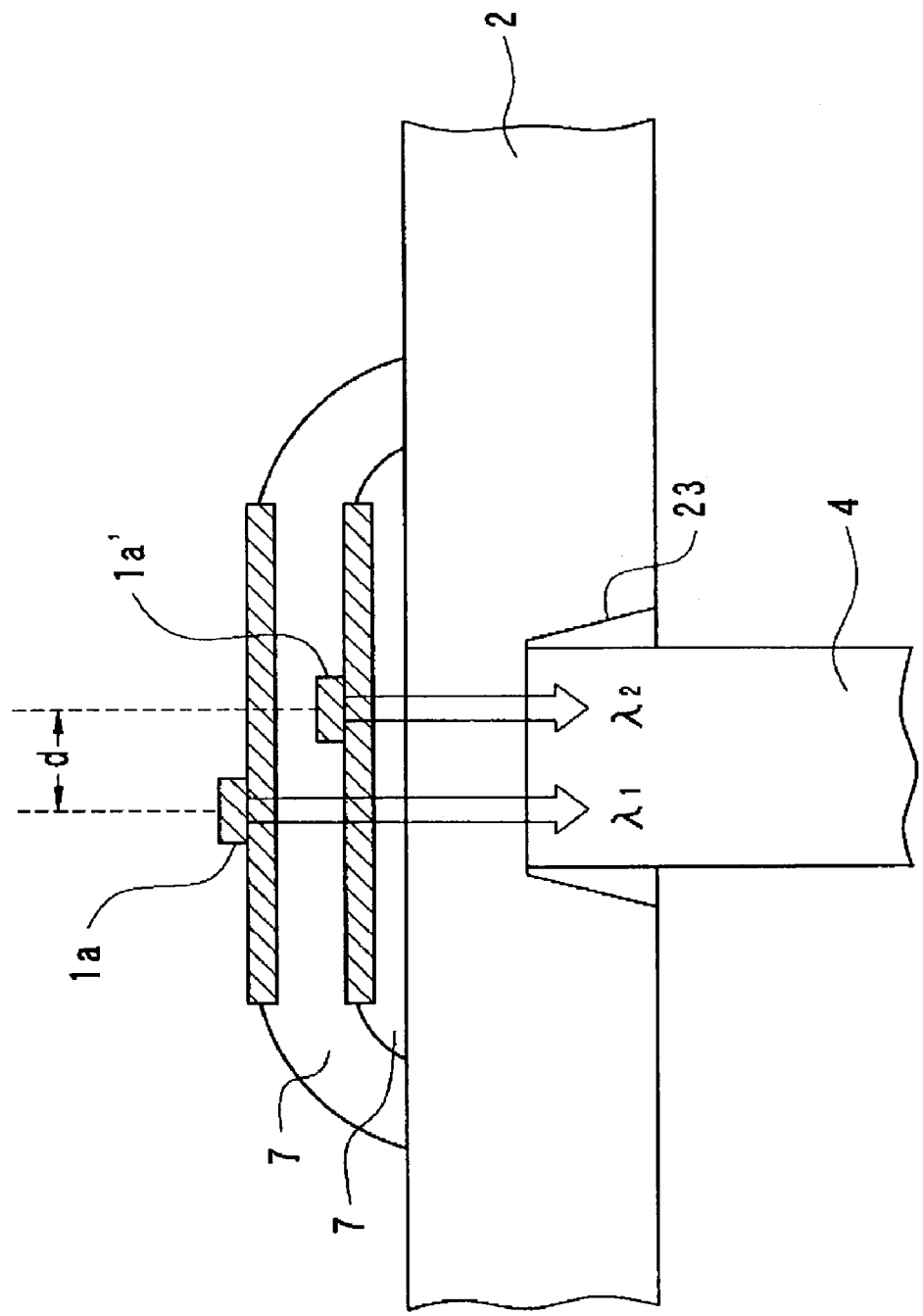
FIG. 5 is a schematic sectional view showing the principal part of another application of the optical communication module of this exemplary embodiment.

Preferably, another surface-emitting laser 1a' made of a tile-like microelement is bonded on the upper or lower surface of the surface-emitting laser 1a with transparent adhesive 7 therebetween, instead of the monitoring photodiode 1b' or on the monitoring photodiode 1b', as shown in FIG. 5. FIG. 5 is a schematic sectional view showing the principal part of another application of the optical communication module of this embodiment. Preferably, the wavelength (λ1) of light emitted from the surface-emitting laser 1a and the wavelength (λ2) of light emitted from the surface-emitting laser 1a' are different from each other.

Preferably, the surface-emitting lasers 1a and 1a' are arranged so that laser light emitted from the surface-emitting laser 1a does not enter the surface-emitting laser 1a' and so that laser light emitted from the surface-emitting laser 1a' does not enter the surface-emitting laser 1a. That is, it is preferable that the surface-emitting lasers 1a and 1a' be placed one on another so that the light-emission center axis of the surface-emitting laser 1a and the light-emission center axis of the surface-emitting laser 1a' are offset by a desired distance d from each other.

Such arrangement is provided to prevent one of the surface-emitting laser from emitting light by being excited by laser light emitted from the other surface-emitting laser.

Consequently, it is possible to easily, speedily, inexpensively, and precisely produce an optical communication module for wavelength division multiplexing (WDM) optical communication in which a plurality of laser light beams having different wavelengths (λ1 and λ2) emitted from a plurality of surface-emitting lasers 1a and 1a' are transmitted by a single optical fiber 4.

Second Exemplary Embodiment

Figure 6:
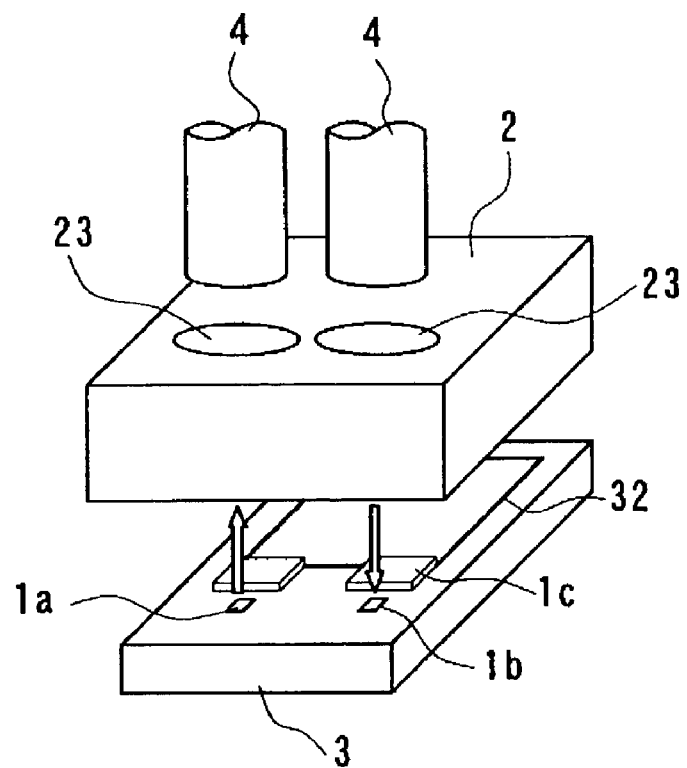
FIG. 6 is a schematic assembly view of an optical communication module according to a second exemplary embodiment.
Figure 7:
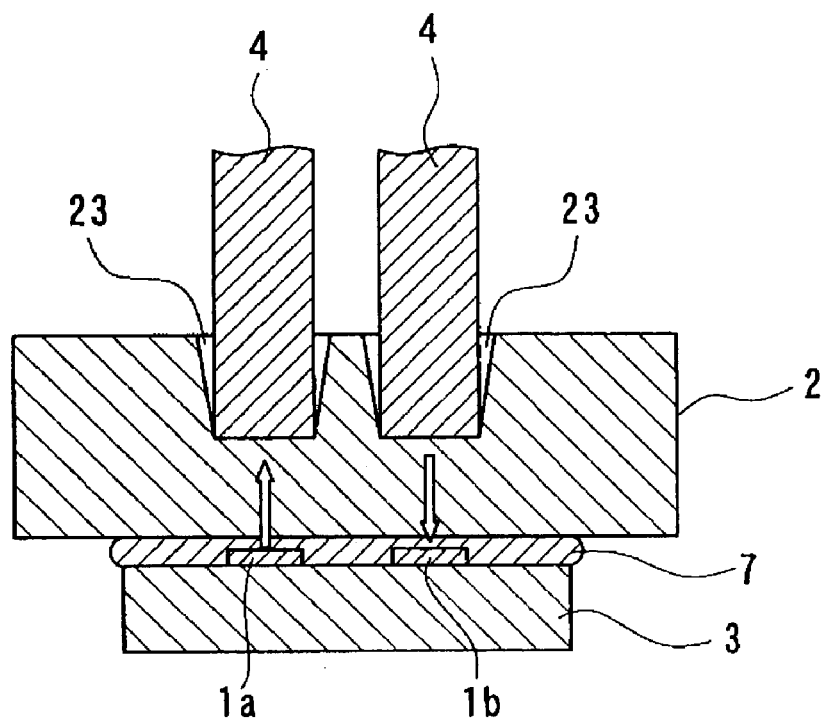
FIG. 7 is a schematic sectional view of the optical communication module.

An optical communication module according to a second exemplary embodiment of the present invention is described below with reference to FIGS. 6 and 7. FIG. 6 is a schematic assembly view of the optical communication module according to the second exemplary embodiment of the present invention. FIG. 7 is a schematic sectional view of the optical communication module shown in FIG. 6. The same components as those of the above optical communication module of the first exemplary embodiment shown in FIGS. 1 to 5 are denoted by the same reference numerals.

In this optical communication module, a surface-emitting laser 1a and a photodiode 1b are bonded on the upper surface of a substrate 3 with adhesive, which is different from the optical communication module of the first exemplary embodiment. A hetero bipolar transistor (HBT) integrated circuit 32 made of a tile-like microelement is also bonded on the upper surface of the substrate 3 with adhesive. The HBT includes a transistor for driving the surface-emitting laser 1a and a transistor for amplifying a detection signal of the photodiode 1b.

The substrate 3 is bonded on a base block 2 with transparent adhesive 7 therebetween so that the surface of the substrate 3 on which the surface-emitting laser 1a, the photodiode 1b, and the HBT 32 are bonded serves as a surface to be bonded to the base block 2 and so that the surface-emitting laser 1a and the photodiode 1b are placed on a side face of the base block 2 opposing the bottom faces of optical-fiber guide holes 23. The surface-emitting laser 1a is placed so that the center axis of the optical-fiber guide hole 23 (first hole) and the light-emission center axis of the surface-emitting laser 1a substantially coincide with each other. The photodiode 1b is placed so that the center axis of the optical-fiber guide hole 23 (second hole) and the light-reception center axis of the photodiode 1b substantially coincide with each other.

Accordingly, in the optical communication module of this exemplary embodiment, the optical fiber 4 and the surface-emitting laser 1a, and the optical fiber 4 and the photodiode 1b can be precisely positioned only by fitting the optical fibers 4 in the optical-fiber guide holes 23, in a manner similar to that in the optical communication module of the first embodiment. This can shorten the production time of the optical communication module, and can reduce production cost. The optical communication module of this embodiment is also applicable to modifications similar to those of the optical communication module of the first embodiment, and can provide similar advantages.

In the optical communication module of this exemplary embodiment, the surface-emitting laser 1a, the photodiode 1b, a driving circuit, an APC circuit, and so on provided on the substrate 3 may be tested before the substrate 3 is bonded to the base block 2. This prevents defective optical communication modules from being produced in the production process, further reduces the production cost, and shortens the production time.

(Production Method for Tile-like Microelement)

A production method for the tile-like microelement and the optical communication module is described below with reference to FIGS. 8 to 17. While a description is given of a production method in which a compound semiconductor device (compound semiconductor element) serving as a tile-like microelement is joined onto a silicon LSI chip serving as a substrate, applications of the present invention are not limited by the type of the semiconductor device and the type of the LSI chip. While the "semiconductor substrate" in this exemplary embodiment refers to an object composed of a semiconductor substance, it includes any substrate composed of a semiconductor substance even when it has a shape other than a plate shape.

<First Step>

Figure 8:
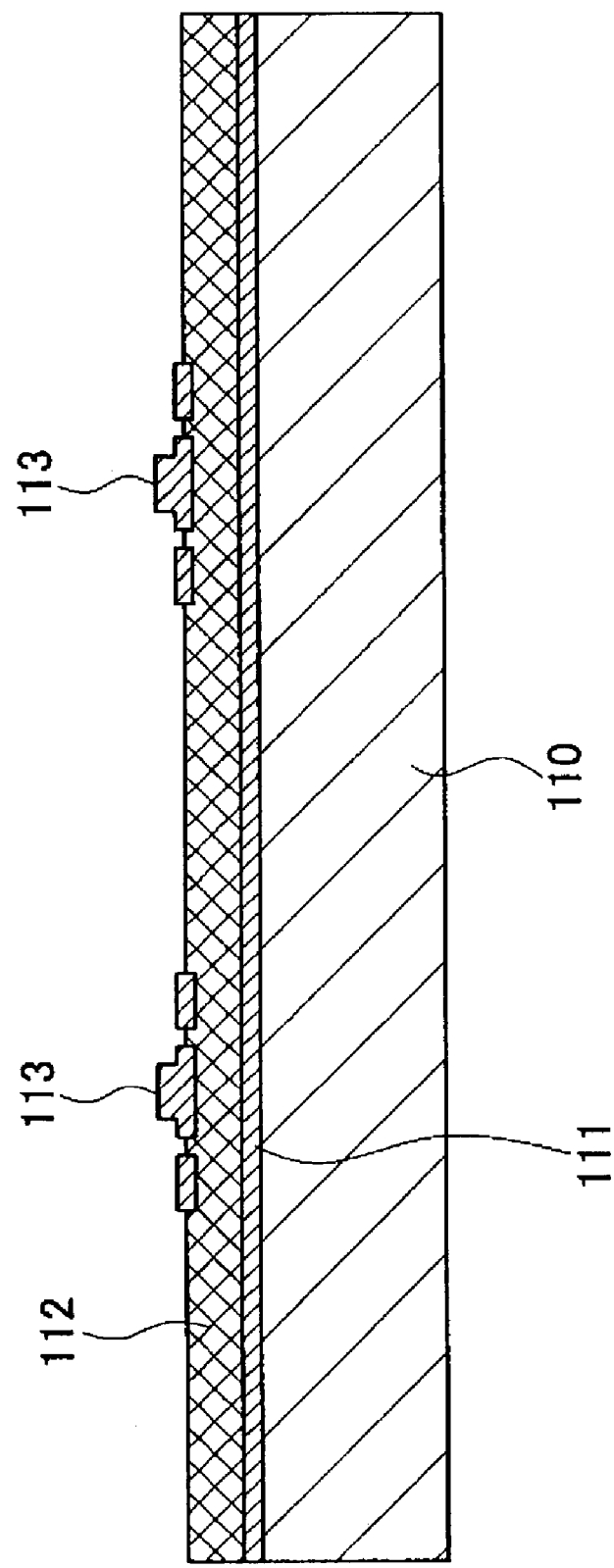
FIG. 8 is a schematic sectional view showing a first step of a production method for the optical communication modules according to the first and second exemplary embodiments.

FIG. 8 is a schematic sectional view showing a first step of a production method for the optical communication module. In FIG. 8, a substrate 110 is a semiconductor substrate, for example, a gallium arsenide compound semiconductor substrate. A sacrificial layer 111 is provided on the upper surface of the substrate 110. The sacrificial layer 111 is composed of aluminum arsenide (AlAs), and has a thickness of, for example, several hundreds of nanometers.

For example, a functional layer 112 is provided on the sacrificial layer 111. The thickness of the functional layer 112 is set at, for example, approximately 1 μm to 10 (20) μm. Semiconductor devices 113 are formed on the functional layer 112. Examples of the semiconductor devices 113 are a light-emitting diode (LED), a vertical-cavity surface-emitting laser (VCSEL), a photodiode (PD), a high electron mobility transistor (HEMT), and a hetero bipolar transistor (HBT). Each of the semiconductor device 113 is formed of a multilayer epitaxial layer disposed on the substrate 110. The semiconductor device 113 is provided with electrodes, and is subjected to an operation test.

<Second Step>

Figure 9:
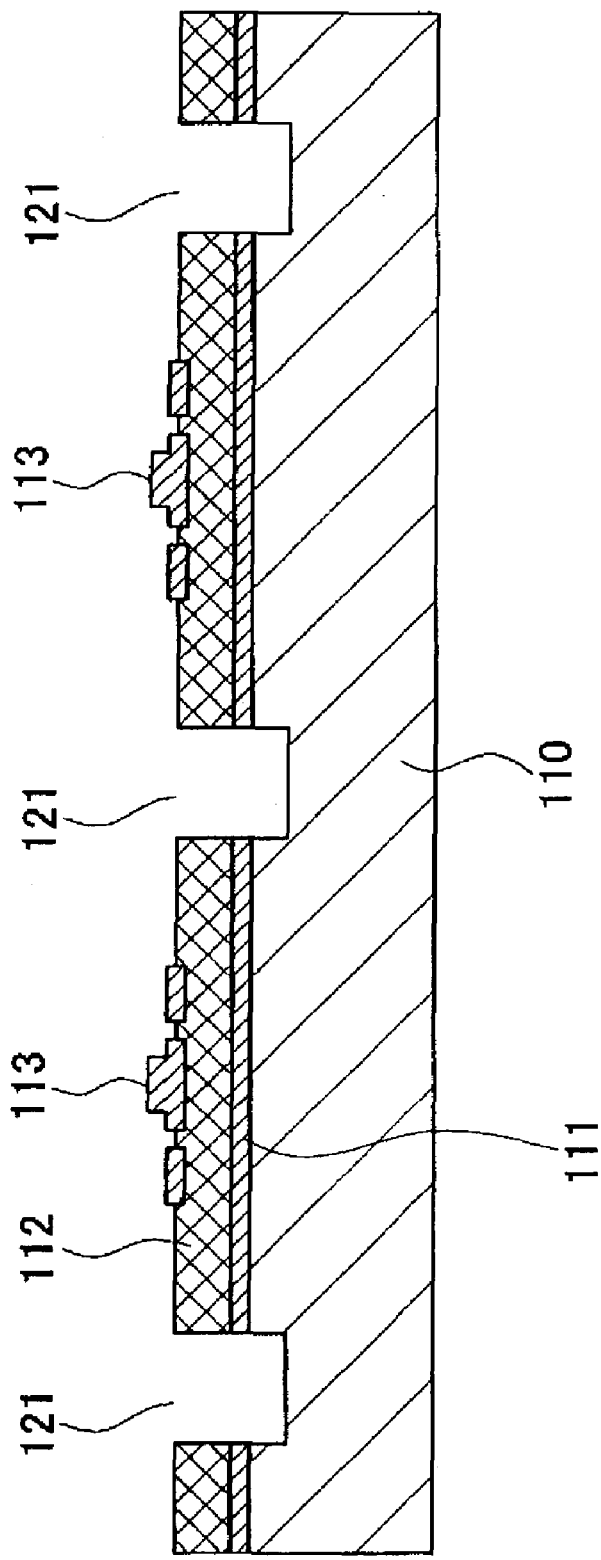
FIG. 9 is a schematic sectional view showing a second step of the production method.

FIG. 9 is a schematic sectional view showing a second step of the production method for the optical communication module. In this step, separation grooves 121 are formed to separate the semiconductor devices 113. The separation grooves 121 have at least a depth such as to reach the sacrificial layer 111. For example, both the width and depth of the separation grooves 121 are set at ten micrometers to several hundreds of micrometers. The separation grooves 121 do not have a dead end, but are connected so that selective etchant, which will be described later, can flow in the separation grooves 121. Furthermore, it is preferable that the separation grooves 121 be arranged in a grid pattern.

By setting the distance between the separation grooves 121 at several tens of micrometers to several hundreds of micrometers, the area of each of the semiconductor devices 113 separated and formed by the separation grooves 121 is set at several tens of micrometers square to several hundreds of micrometers square. The separation grooves 121 are formed by photolithography and wet etching, or by dry etching. The separation grooves 121 may be formed with a U-shaped dicing tool as long as the substrate will not be cracked.

<Third Step>

Figure 10:
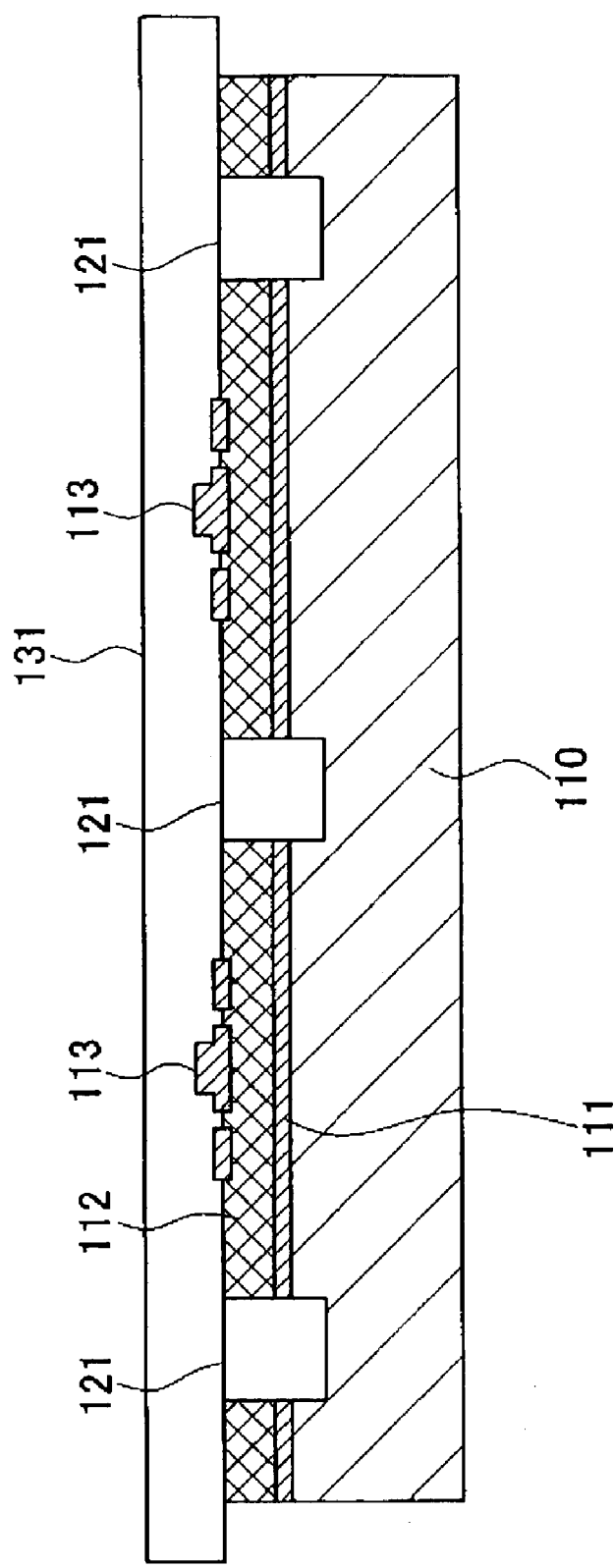
FIG. 10 is a schematic sectional view showing a third step of the production method.

FIG. 10 is a schematic sectional view showing a third step of the production method for the optical communication module. In this step, an intermediate transfer film 131 is bonded on a surface (close to the semiconductor devices 113) of the substrate 110. The intermediate transfer film 131 is a belt-shaped flexible film coated with adhesive.

<Fourth Step>

Figure 11:
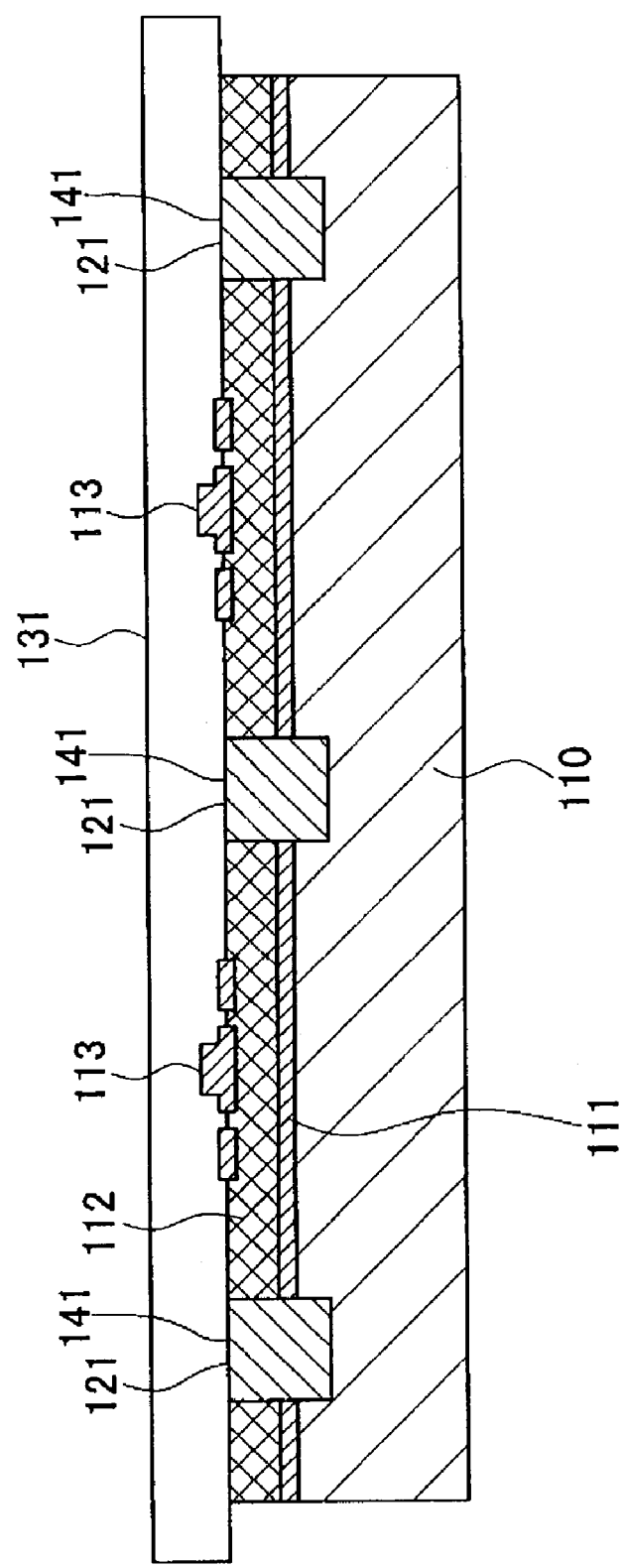
FIG. 11 is a schematic sectional view showing a fourth step of the production method.

FIG. 11 is a schematic sectional view showing a fourth step of the production method for the optical communication module. In this step, selective etchant 141 is injected in the separation grooves 121. In this step, a low-concentration hydrochloric acid that has a high selectivity with respect to aluminum arsenide is used as the selective etchant 141 in order to selectively etch only the sacrificial layer 111.

<Fifth Step>

Figure 12:
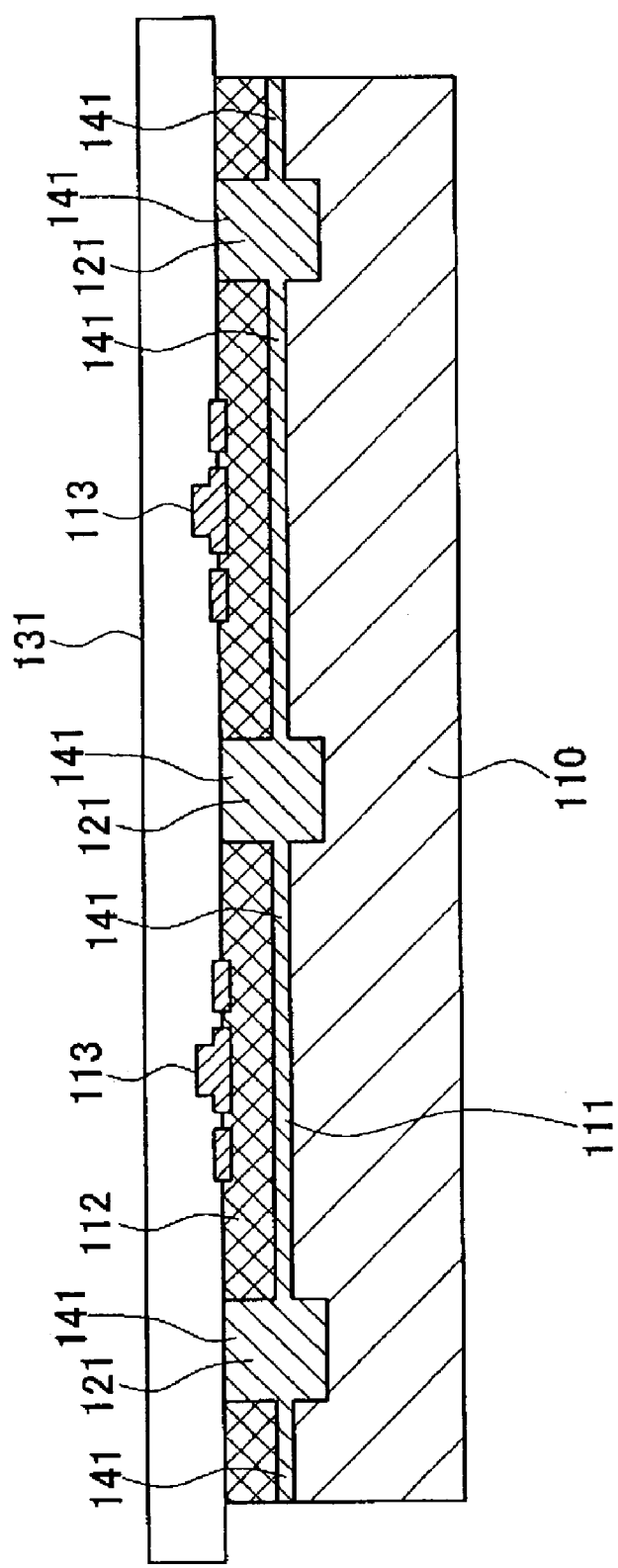
FIG. 12 is a schematic sectional view showing a fifth step of the production method.

FIG. 12 is a schematic sectional view showing a fifth step of the production method for the optical communication module. When a predetermined time passes after the selective etchant 141 is injected in the separation grooves 121 in the fourth step, the entire sacrificial layer 111 is removed from the substrate 110 by selective etching in this step.

<Sixth Step>

Figure 13:
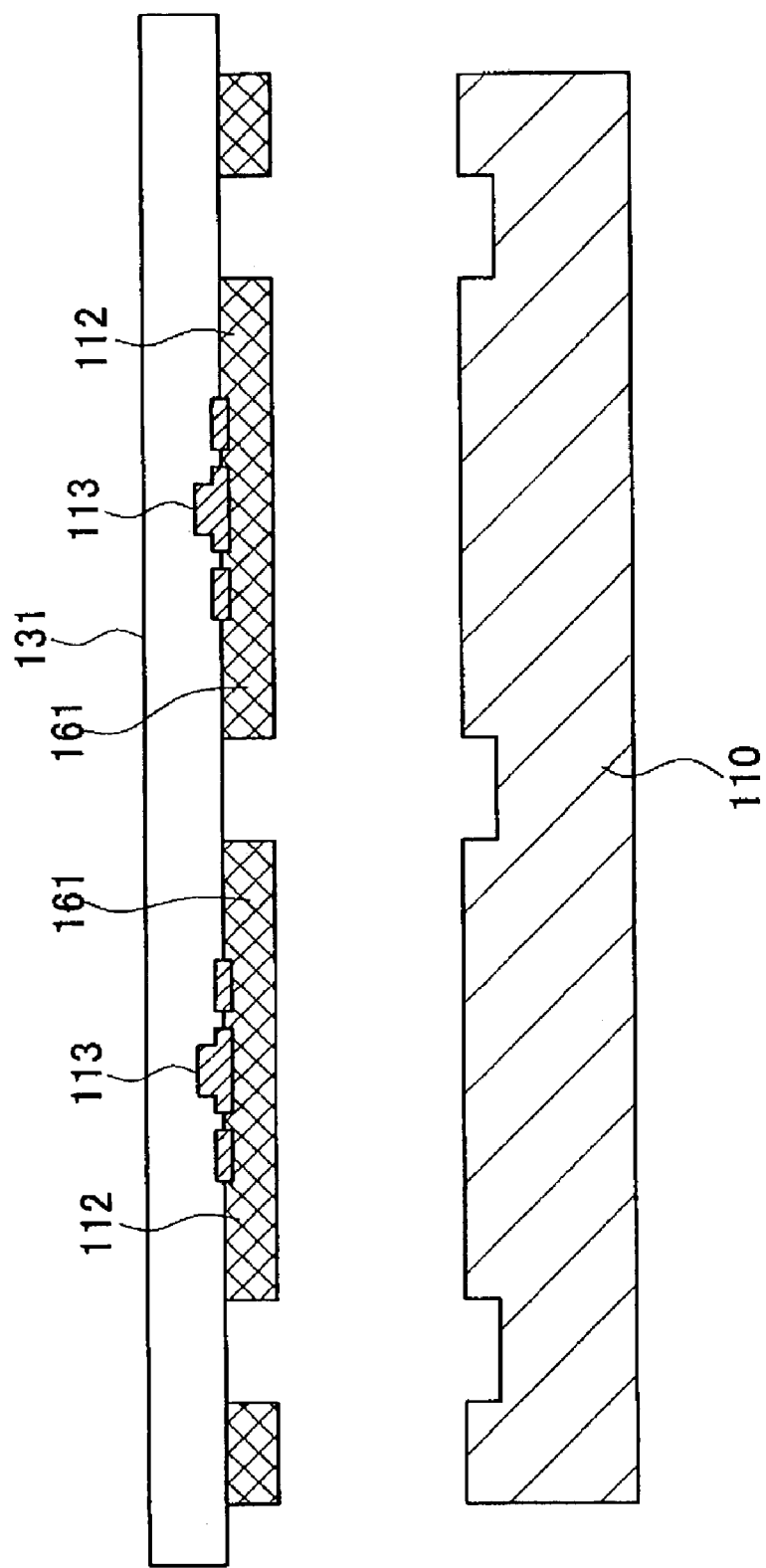
FIG. 13 is a schematic sectional view showing a sixth step of the production method.

FIG. 13 is a schematic sectional view showing a sixth step of the production method for the optical communication module. When the entire sacrificial layer 111 is etched in the fifth step, the functional layer 112 is separated from the substrate 110. In this step, the functional layer 112 bonded to the intermediate transfer film 131 is separated from the substrate 110 by separating the intermediate transfer film 131 from the substrate 110.

Consequently, the functional layer 112 having the semiconductor devices 113 is divided into semiconductor elements ("tile-like microelements" in the above exemplary embodiment) 161 having a predetermined shape (e.g., the shape of a miniature tile) by forming the separation groves 121 and by etching the sacrificial layer 111, and the semiconductor elements 161 are bonded and held on the intermediate transfer film 131. It is preferable that the thickness of the functional layer 112 be, for example, 1 micrometer to 8 micrometers and that the size (length and wise) be, for example, several tens of micrometers to several hundreds of micrometers.

<Seventh Step>

Figure 14:
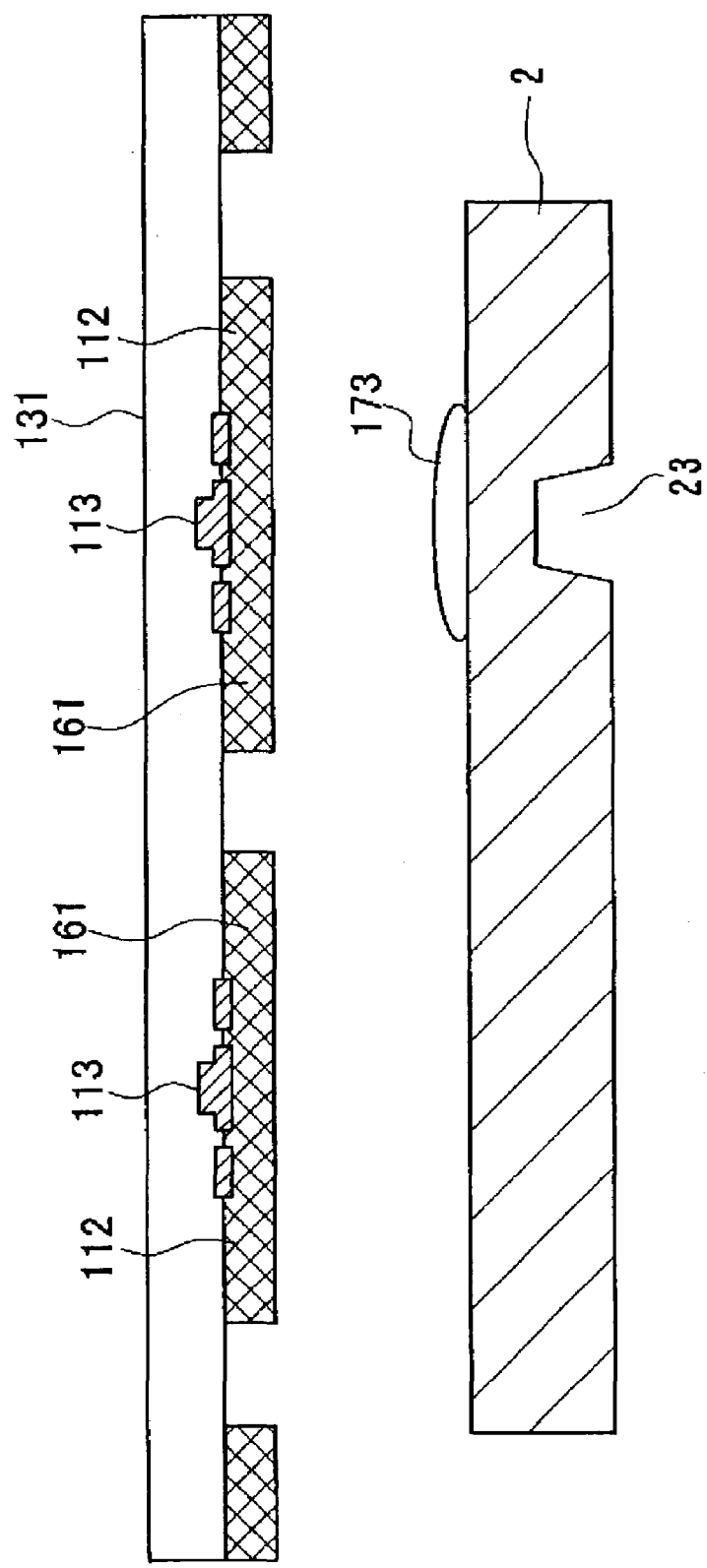
FIG. 14 is a schematic sectional view showing a seventh step of the production method.

FIG. 14 is a schematic sectional view showing a seventh step of the production method for the optical communication module. In this step, the tile-like microelements 161 are aligned with desired positions on a base block 2 serving as a final substrate by moving the intermediate transfer film 131 (on which the tile-like microelements 161 are bonded). The base block 2 has optical-fiber guide holes 23, as shown in FIGS. 1 and 2. Accordingly, for example, alignment is performed so that the center axis of an optical-fiber guide hole 23 substantially coincides with the light-emission center axis of a surface-emitting laser 1a formed by a tile-like microelement 161.

Transparent adhesive 173 is applied to the desired positions on the base block 2 to bond the tile-like microelements 161. The adhesive may be applied to the tile-like microelements 161.

<Eighth Step>

Figure 15:
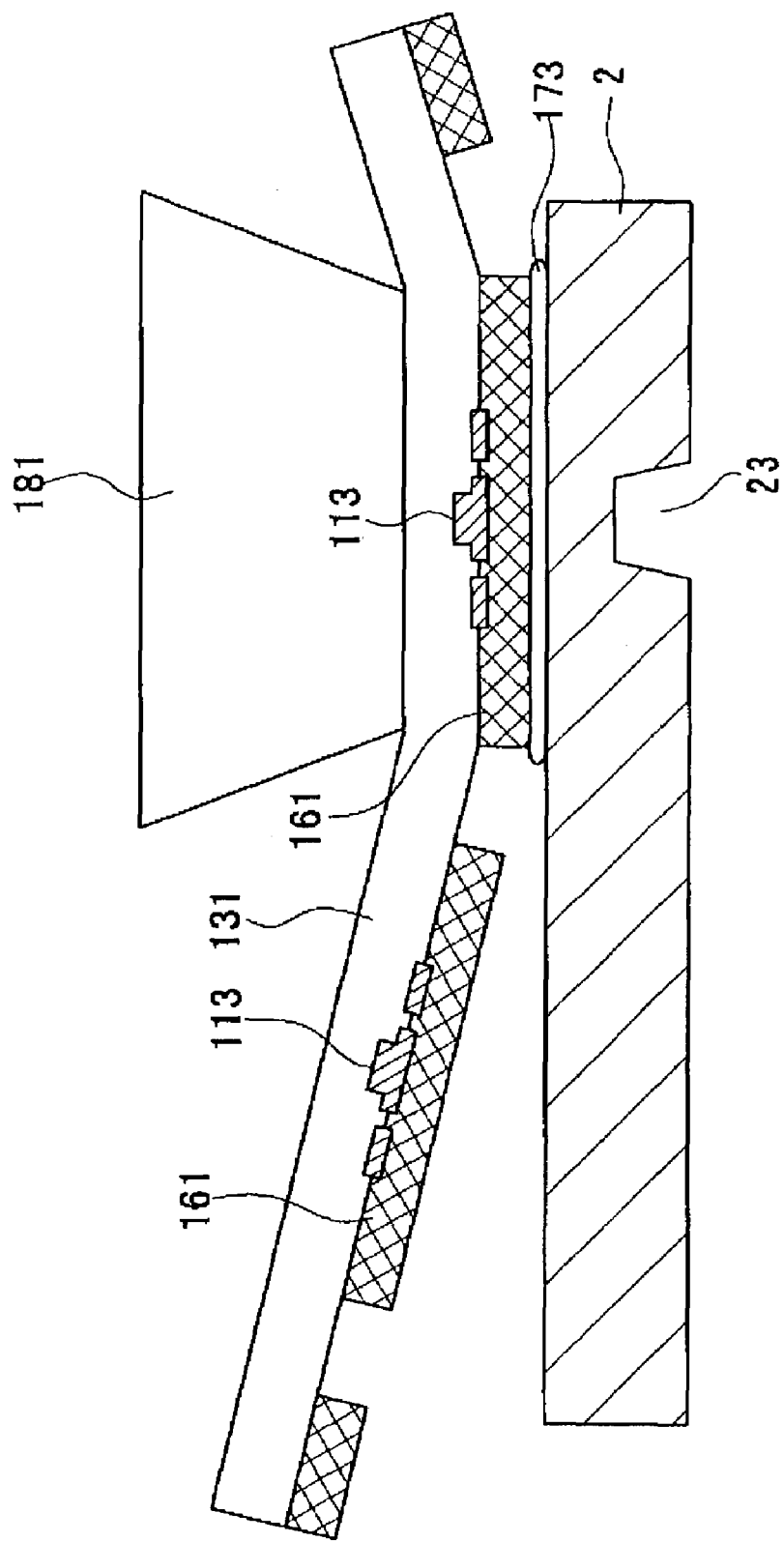
FIG. 15 is a schematic sectional view showing an eighth step of the production method.

FIG. 15 is a schematic sectional view showing an eighth step of the production method for the optical communication module. In this step, the tile-like microelements 161 aligned with the desired positions of the base block 2 are joined to the base block 2 by being pressed through the intermediate transfer film 131 by a back pressing pin 181. Since the adhesive 173 is applied on the desired positions, the tile-like microelements 161 are bonded to the desired positions on the base block 2.

<Ninth Step>

Figure 16:
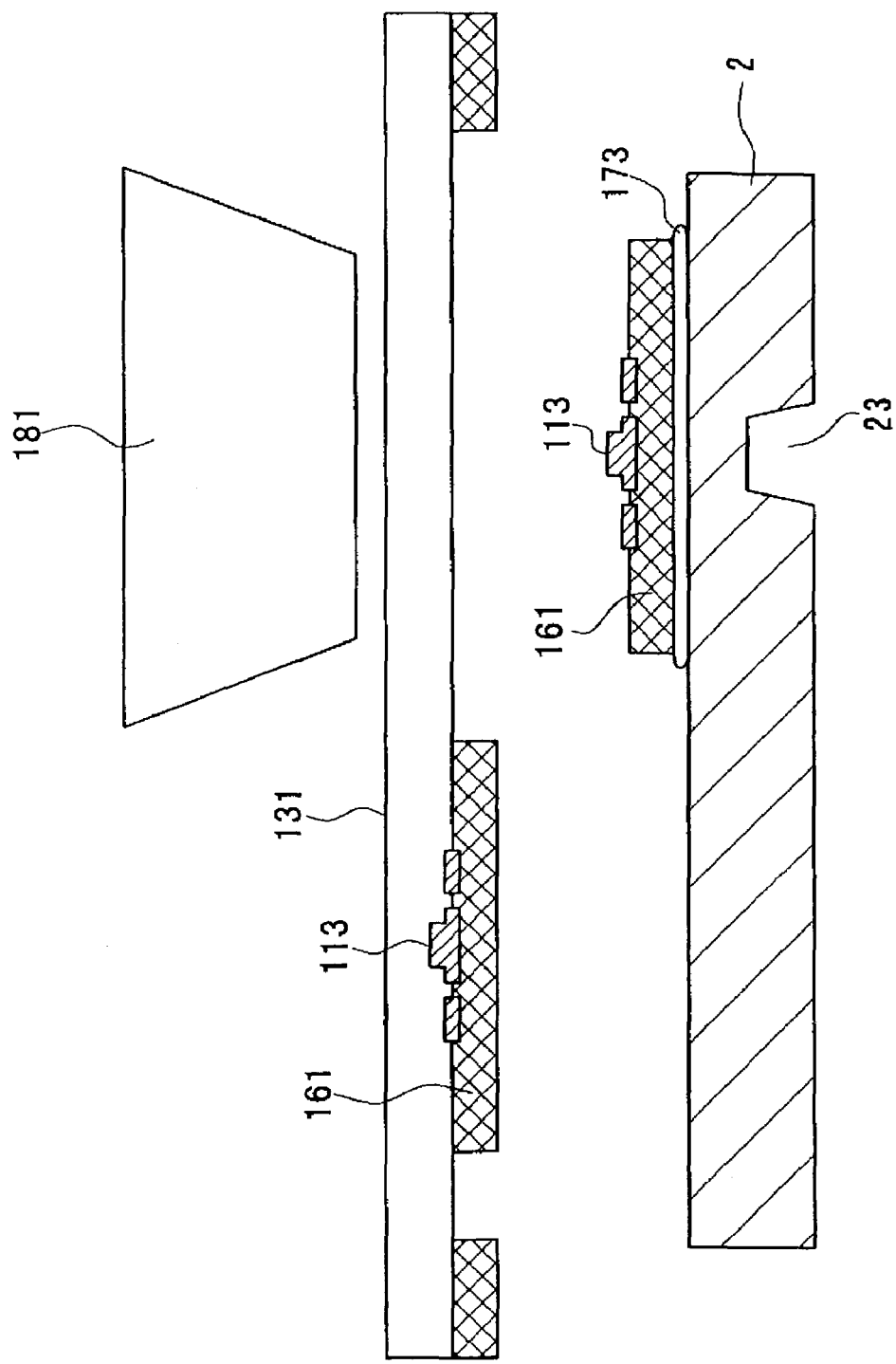
FIG. 16 is a schematic sectional view showing a ninth step of the production method.

FIG. 16 is a schematic sectional view showing a ninth step of the production method for the optical communication module. The intermediate transfer film 131 is stripped off the tile-like microelements 161 by removing the adhesive force of the intermediate transfer film 131.

The adhesive on the intermediate transfer film 131 is UV-setting or thermosetting. When a UV-setting adhesive is used, the adhesive force of the intermediate transfer film 131 is removed by making the back pressing pin 181 of a transparent material and by applying ultraviolet rays (UV) from the leading end of the back pressing pin 181. When a thermosetting adhesive is used, the back pressing pin 181 is heated. Alternatively, the adhesive force may be removed by irradiating the entire surface of the intermediate transfer film 131 with ultraviolet rays after the sixth step. Even after the adhesive force is removed, in actuality, the intermediate transfer film 131 is slightly adhesive, and the tile-like microelements 161 are quite thin and light. Therefore, the tile-like microelements 161 are held on the intermediate transfer film 131.

<Tenth Step>

This step is not illustrated. In this step, the tile-like microelements 161 are actually joined to the base block 2, for example, by heating.

<Eleventh Step>

Figure 17:
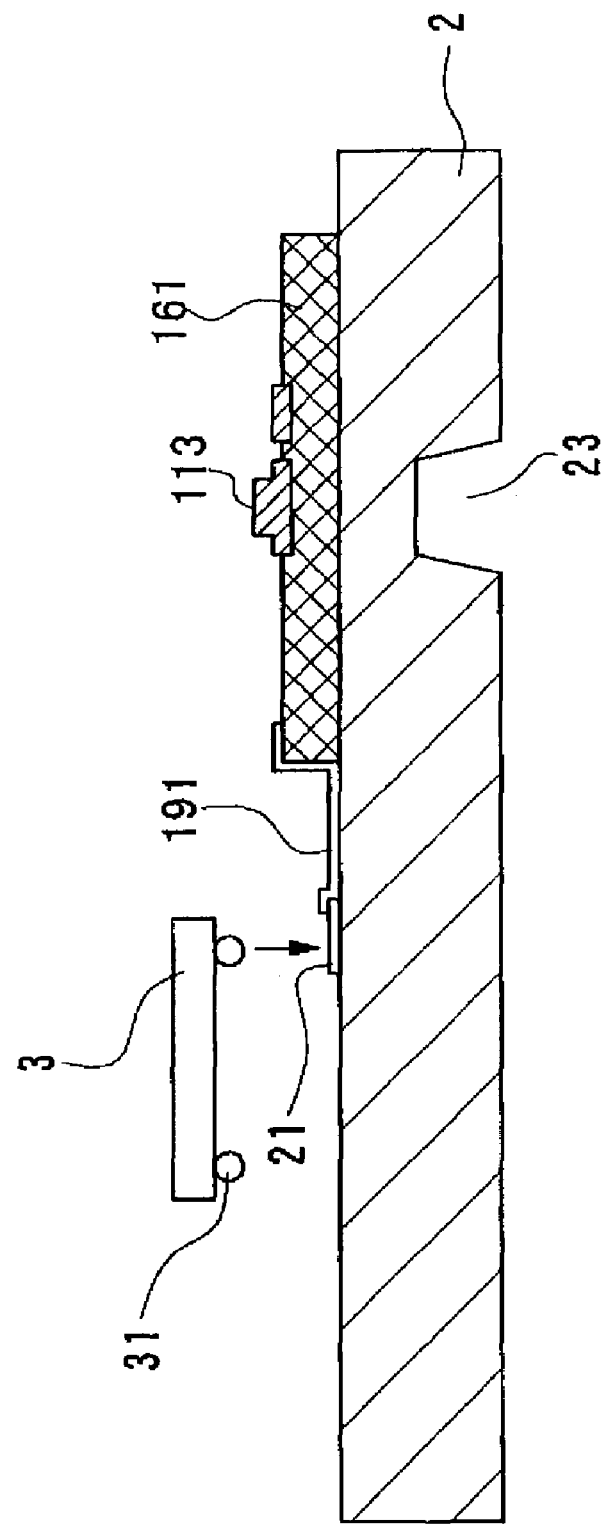
FIG. 17 is a schematic sectional view showing an eleventh step of the production method.

FIG. 17 is a schematic sectional view showing an eleventh step of the production method for the optical communication module. In this step, electrodes of each of the tile-like microelements 161 are electrically connected to circuits on the base block 2 (e.g., bonding pads 21 provided on the base block 2 beforehand) by wires 191. Subsequently, as shown in FIGS. 1 and 2, by mounting bumps 31 of a substrate 3 on the bonding pads 21, the circuits of the substrate 3 and the semiconductor device 113 (e.g., a surface-emitting laser 1a) formed by the tile-like microelement 161 are connected electrically. Through these steps, one optical communication module is completed.

(Applications)

Applications of the optical communication module of the above exemplary embodiment are described below.

Figure 18:
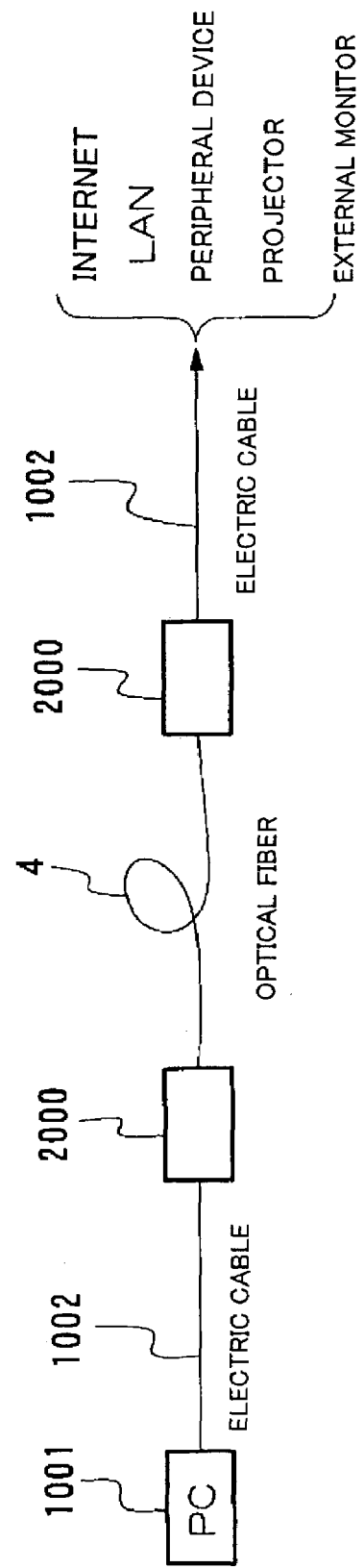
FIG. 18 is a schematic conceptual view showing an example of short-haul communication using the optical communication module of the exemplary embodiment.

FIG. 18 is a schematic conceptual view showing an application in which the optical communication module of the above exemplary embodiment is used for general short-haul communication. An electric signal output from a personal computer 1001 is transmitted to an optical communication module 2000 of the above exemplary embodiment through an electric cable 1002. The electric signal is converted into an optical signal by the optical communication module 2000, and is then output to an optical fiber 4. The optical signal is transmitted to an optical communication module of a communication partner through the optical fiber 4. The optical signal is converted into an electric signal by the optical communication module 2000, and is output to a peripheral device such as the Internet, a LAN, a projector, or an external monitor. A signal can be transmitted in a direction reverse to the direction of flow of the above signal, in a manner similar to the above.

In this application, the speed of communication between the personal computer and the Internet, the LAN, or the peripheral device can be increased at a lower cost than before. Moreover, compact wiring in the communication can be achieved, and electromagnetic interference (EMI) can be reduced.

Figure 19:
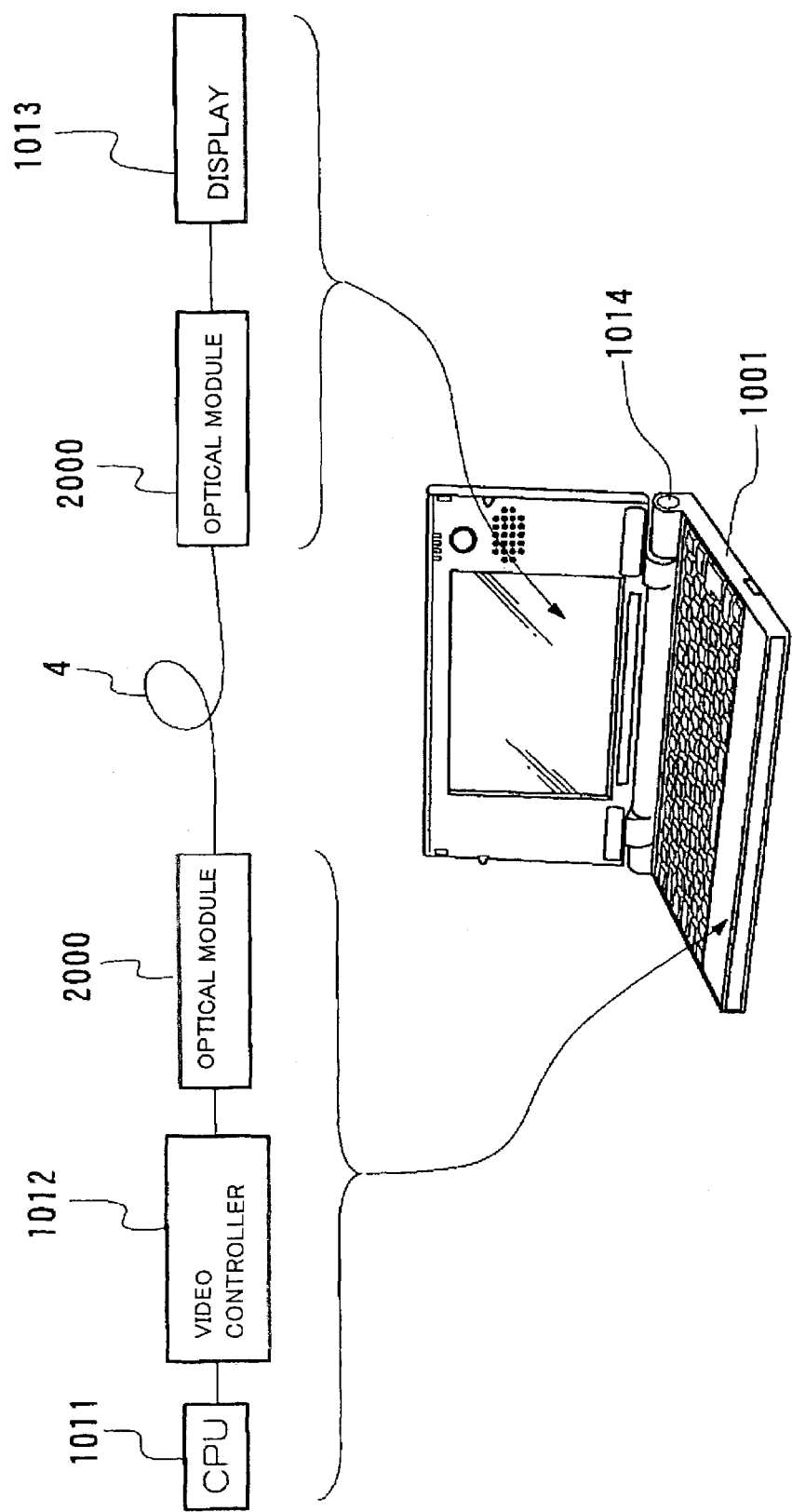
FIG. 19 is a schematic conceptual view showing an example of a notebook personal computer in which the optical communication module of the exemplary embodiment is incorporated.

FIG. 19 is a schematic conceptual view showing an application in which the optical communication module of the above exemplary embodiment is used as a component of a notebook personal computer. A notebook personal computer 1001 includes a CPU 1011, a video controller 1012, a pair of optical communication modules 2000, an optical fiber 4, and a display 1013. A signal representing an image output from the CPU 1011 is input to the video controller 1012 and is converted into a desired image signal. The image signal is input to the optical communication module 2000 placed in the main body (keyboard side) of the notebook personal computer 1001 to be converted into an optical signal, and is then output to the optical fiber 4. The optical signal passes through the optical fiber 4, is input to the optical communication module 2000 placed in a cover (display side) of the notebook personal computer 1001 to be converted into an electric signal, and is output to the display 1013.

Consequently, an image corresponding to the signal representing the image output from the CPU 1011 is displayed on the display 1013. There are restrictions, such as a restriction on dimensions and a restriction to prevent electromagnetic interference (EMI), on routing of signal lines in a hinge portion 1014 to connect the main body and the cover of the notebook personal computer 1001. In this application, however, since the optical fiber 4 is used for routing of the signal lines in the hinge portion 1014, 1) it is only necessary to pass one or several optical fibers through the hinge portion 1014 because the transmission rate of one communication path is increased, and 2) electromagnetic interference (EMI) can be reduced because light does not emit electromagnetic waves. While the optical communication module to be applied to the notebook personal computer 1001 or a portable telephone must be ultra small, the optical communication module of this embodiment can be easily incorporated in the notebook personal computer 1001 or the portable telephone.

The technical field of the present invention is not limited to the above exemplary embodiments, and various changes are possible without departing from the scope of the present invention. The specific materials, layer layout, and so on mentioned in the above embodiments are just exemplary, and may be changed appropriately.

For example, the adhesive used to bond the surface-emitting laser or the photodiode on the base block and the adhesive used to bond the substrate on the base block may be applied by a droplet jet method in the above exemplary embodiments. This makes it possible to substantially reduce the amount of the adhesive, nontransparent materials, and transparent protective materials to be used during production of the optical communication module, to reduce the production cost, and to shorten the production time.

While the surface-emitting laser is used as the light-emitting element in the above embodiments, an edge-emitting laser or a photodiode is also applicable as the light-emitting element.

It is preferable that the upper surfaces of the surface-emitting laser and the photodiode be covered with a nontransparent member in the above exemplary embodiments. This can reduce stray light due to light emitted from the surface-emitting laser or the optical fiber, and can reduce noise.

[Advantages]

As is evident from the above description, in the present invention, since tile-like microelements are bonded to the transparent base block having an optical-fiber guide hole, the incident end or emergent end of an optical fiber can be easily and precisely aligned with a light-emitting element or a light-receiving element.

What is claimed is:

1. An optical communication module, comprising:
   a microelement;
   a base block that has a first surface and a second surface located opposite to the first surface, a first face of the microelement contacting the first surface;
   a metal wire that is provided from a second face of the microelement that is opposite to the first face onto the first surface of the base block; and
   a substrate that has at least one driver circuit for the microelement, the driver circuit electrically connected to the metal wire;
   the second surface including an optical-fiber guide hole into which an optical fiber is inserted; and
   a portion of the base block separating the microelement from the optical-fiber guide hole.

2. The optical communication module according to claim 1, wherein the microelement contacts the first surface of the base block through a transparent adhesive.

3. The optical communication module according to claim 1, wherein the microelement comprises at least one of a light-emitting element and a light-receiving element.

4. The optical communication module according to claim 3, wherein a center axis of the optical-fiber guide hole substantially coincides with a light-emission center axis of the light-emitting element.

5. The optical communication module according to claim 3, wherein a center axis of the optical-fiber guide hole substantially coincides with a light-reception center axis of the light-receiving element.

6. The optical communication module according to claim 3, further comprising a second microelement, the microelement having the light-emitting element being bonded on the second microelement having a monitoring light-receiving element to detect light emitted from the light-emitting element of the microelement.

7. The optical communication module according to claim 6, wherein a light receiving section of the monitoring light-receiving element is placed on a light-emission center axis of the light-emitting element.

8. The optical communication module according to claim 6, further comprising an automatic power control circuit to control an amount of light emitted from the light-emitting element on the basis of an amount of received light detected by the monitoring light-receiving element.

9. The optical communication module according to claim 3, further comprising a second microelement, the microelement having the light-emitting element being bonded on at least the second microelement having a light-emitting element that emits light having a wavelength different from the wavelength of light emitted from the light-emitting element of the microelement.

10. The optical communication module according to claim 9, wherein all of the light-emitting elements are surface-emitting lasers, and are arranged so that light emitted from one of the surface-emitting lasers does not enter at least one of the other surface-emitting lasers.

11. The optical communication module according to claim 1, wherein the microelement is bonded to the base block, the microelement comprising at least two tile-like microelements, at least one of the tile-like microelements having a light-emitting element, and at least one of the other tile-like microelements having a light-receiving element.

12. The optical communication module according to claim 1, wherein an optical fiber fits in the optical-fiber guide hole.

13. The optical communication module according to claim 12, further comprising:
   a housing connected to the base block so that one side thereof is substantially parallel to the longitudinal direction of the optical fiber fitted in the guide optical-fiber guide hole; and
   a fiber-fixing adhesive covers the base block, the housing, and the optical fiber around the optical-fiber guide hole of the base block.

14. An electronic device, comprising:
   the optical communication module according to claim 1.

15. The optical communication module according to claim 1, wherein a side face of the optical-fiber guide hole is inclined.

16. An optical communication module, comprising:
   a laser;
   a base block that has a first surface and a second surface located opposite to the first surface, a first face of the laser contacting the first surface, the base block being made of a transparent member having an optical-fiber guide hole, wherein a light emitted by the laser passes through a portion of the base block toward the optical-fiber guide hole;
   a bonding pad provided on the first surface of the base block; and
   a metal wire that is provided from a second face of the microelement that is opposite to the first face onto the bonding pad.

17. The optical communication module according to claim 16, further comprising:
   a light-receiving element; and
   an automatic power control circuit for controlling the laser on the basis of an amount of a light detected by the light-receiving element, the laser being disposed between the light-receiving element and the optical-fiber guide hole.

18. The optical communication module according to claim 16, further comprising a light-receiving element in which a light receiving section of the light-receiving element is placed on a light emission center axis of the laser.

19. An optical communication module, comprising:
a first microelement including at least one tile-like microelement;
a second microelement including at least one tile-like microelement is disposed above the first microelement with an adhesive,
the adhesive contacting the substrate, and
the first microelement being covered by the adhesive; and
a base block, wherein the first microelement being bonded to the base block,
the base block being made of a transparent member having an optical-fiber guide hole that defines a concave portion, and
a portion of the base block being positioned between the optical-fiber guide hole and the at least one tile-like microelement.

* * * * *